United States Patent [19]
Kim

[11] Patent Number: 5,703,534
[45] Date of Patent: Dec. 30, 1997

[54] OPERATIONAL TRANSCONDUCTANCE AMPLIFIER WITH GOOD LINEARITY

[75] Inventor: Young Hwan Kim, Seoul, Rep. of Korea

[73] Assignee: Korea Telecommunication Authority, Seoul, Rep. of Korea

[21] Appl. No.: 579,952

[22] Filed: Dec. 28, 1995

[30] Foreign Application Priority Data

Dec. 29, 1994 [KR] Rep. of Korea ............... 1994-38474

[51] Int. Cl.$^6$ .................... H03F 3/16; H03F 3/45
[52] U.S. Cl. ............................ 330/277; 330/253
[58] Field of Search ........................ 330/253, 277, 330/310, 311

[56] References Cited

U.S. PATENT DOCUMENTS

| | | | |
|---|---|---|---|
| 4,583,037 | 4/1986 | Sooch | 330/277 X |
| 5,039,954 | 8/1991 | Bult et al. | 330/277 |

Primary Examiner—Steven Mottola
Attorney, Agent, or Firm—Merchant, Gould, Smith, Edell, Welter & Schmidt, P.A.

[57] ABSTRACT

An operational transconductance amplifier with a good linearity, comprising a first MOS transistor having its one terminal connected to a ground voltage source and its gate terminal for receiving a circuit input voltage, a second MOS transistor having its one terminal connected to the other terminal of the first MOS transistor and its other terminal connected to a supply voltage source, a reference voltage generator for generating a reference voltage, and an operational amplifier having its negative input terminal connected to a junction between the first and second MOS transistors, its positive input terminal connected to an output terminal of the reference voltage generator and its output terminal connected to a gate terminal of the second MOS transistor. The first MOS transistor acts to convert the input voltage into an output current. The second MOS transistor acts to transfer current flowing through the first MOS transistor to its output terminal.

1 Claim, 6 Drawing Sheets

OPERATIONAL TRANSCONDUCTANCE AMPLIFIER WITH GOOD LINEARITY

BACKGROUND OF THE INVENTION

1. Field of the Invention

The present invention relates to an operational transconductance amplifier (referred to hereinafter as OTA) with a good linearity.

2. Description of the Prior Art

Generally, a current-mode operation technique has widely been used in a high-speed analog signal process. The current-mode operation technique is particularly useful to a high-speed communication integrated circuit (IC). An OTA acts to convert the input voltage into current and is an essential component to the current-mode operation technique.

Figure 1:
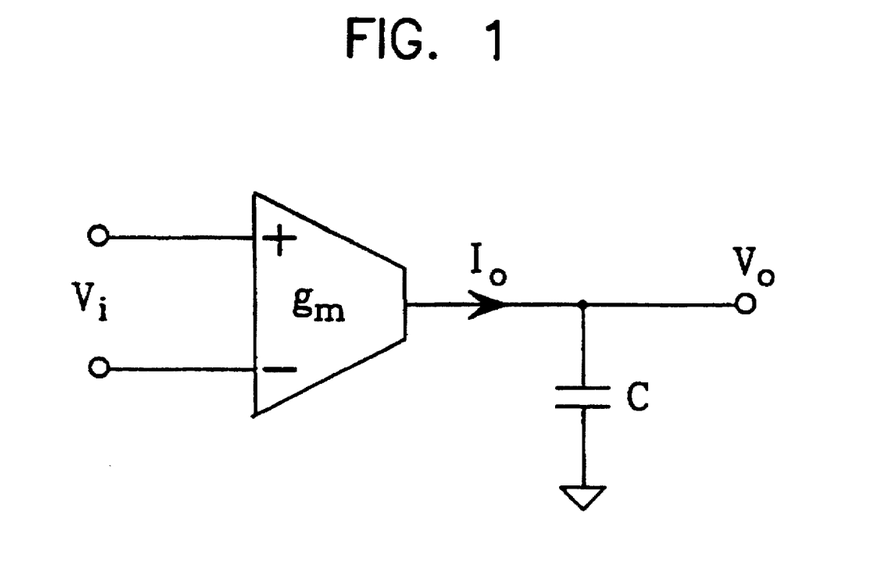
FIG. 1 is a circuit diagram of a conventional integrator employing an OTA and a capacitor.

FIG. 1 is a circuit diagram of a conventional integrator employing an OTA and a capacitor C. Here, the integrator circuit has an input/output transfer function as follows:

$$I_O = g_m V_i$$

$$\frac{V_0}{V_i}(S) = \frac{1}{S} \cdot \frac{g_m}{C}$$

The integrator with the above-mentioned construction is basically used in implementing an analog signal processing system or a filter using the current-mode operation technique.

The performance of OTA is an important factor for determining the performance of various systems. Namely, all functions of OTA such as the operating frequency, linearity and input signal range determine the overall circuit performance. In this connection, the improvement in all functions of OTA has been proposed.

Figure 2A:
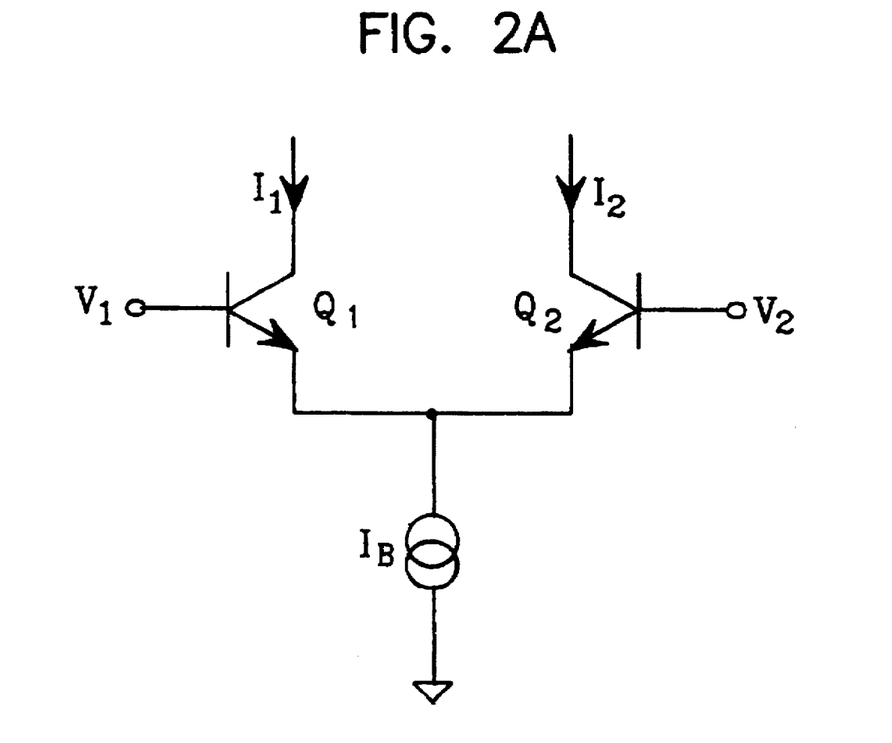
FIGS. 2A and 2B are circuit diagrams of conventional OTAs employing bipolar junction transistors.

FIG. 2A is a circuit diagram of a conventional OTA employing bipolar junction transistors. As shown in this drawing, a differential pair is provided as an input circuit of OTA. The differential pair includes two bipolar junction transistors $Q_1$ and $Q_2$ having their emitters connected in common to each other, end a current source $I_B$. Alternatively, CMOS transistors may be used instead of the bipolar junction transistors. In this case, the CMOS transistors have their sources connected in common to each other.

Figure 2B:
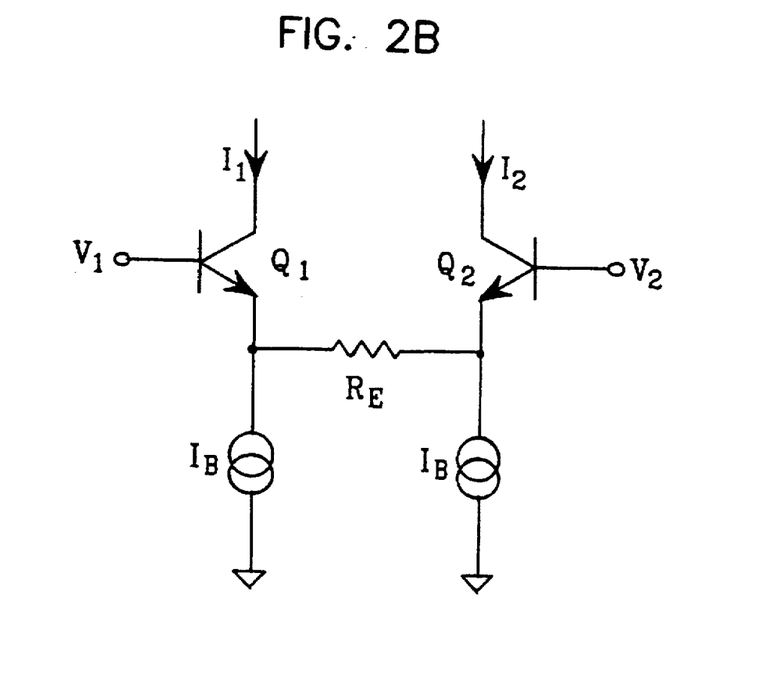

A resistor $R_E$ may be connected between the emitters of the bipolar junction transistors $Q_1$ and $Q_2$, as shown in FIG. 2B, to enlarge the input signal range.

In a manner similar to the bipolar junction transistor process, a general CMOS transistor process employs a differential pair for embodying the OTA. The CMOS transistor process is desirable in that the input signal range is readily adjustable and wider than that in the bipolar junction transistor process, but it has the disadvantage that the input signal range is limited.

For this reason, many studies have steadily been made to embody an OTA with a high linearity and a wide input signal range using a CMOS circuit.

Conventional OTAs employing MOS transistors can generally be classified into two types according to a using region of MOS transistor.

Firstly, the OTA can be embodied by using a saturation region of the MOS transistor. In this case, a quadratic input/output voltage-current relational expression is mainly used.

Secondly, the OTA can be embodied by using a linear region of the MOS transistor.

Figure 3A:
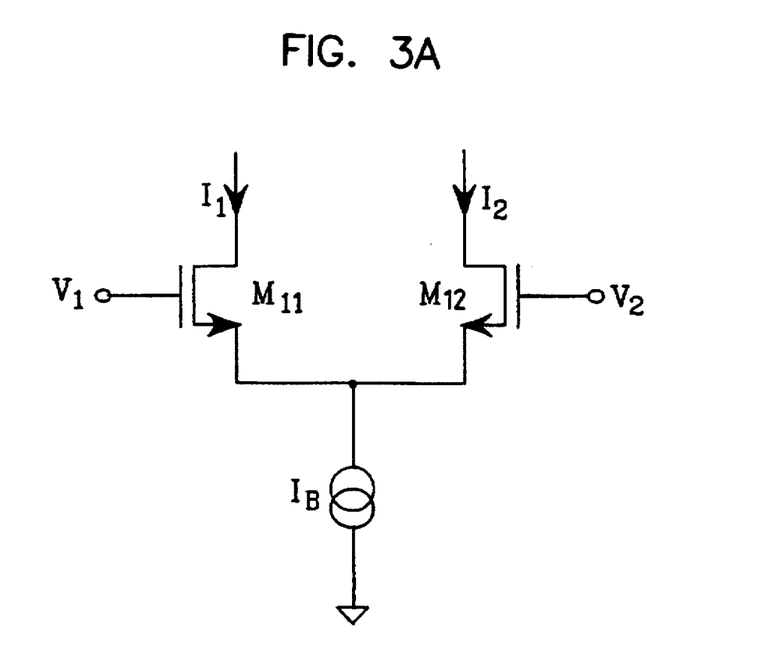
FIGS. 3A to 3C are circuit diagrams of conventional OTAs using saturation regions of MOS transistors.
Figure 3B:
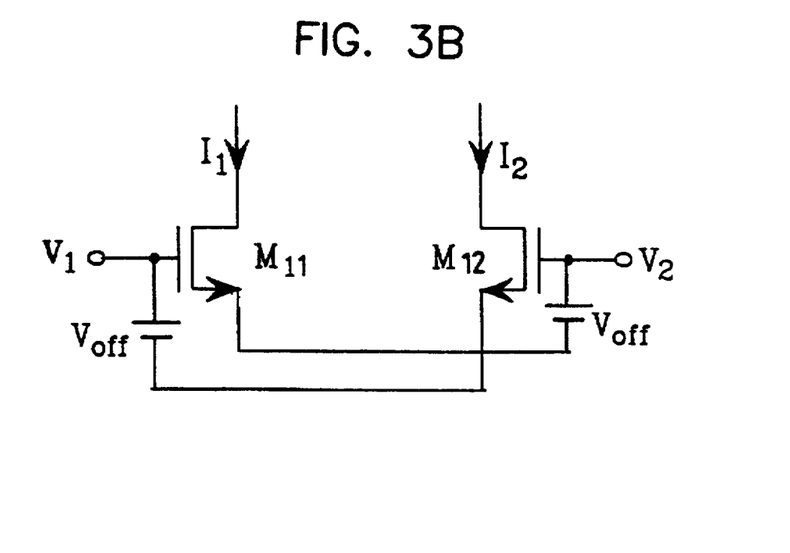
Figure 3C:
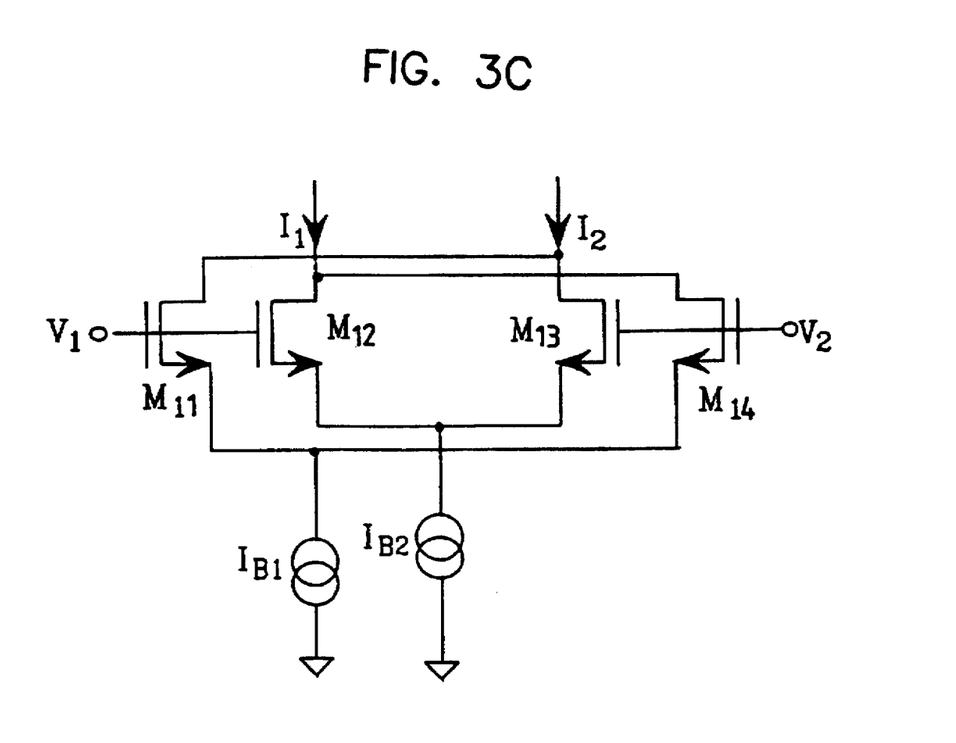

FIGS. 3A to 3C are circuit diagrams of conventional OTAs using saturation regions of MOS transistors. In these drawings, the reference numerals $M_{11}$ to $M_{14}$ designate MOS transistors, respectively, and the reference numerals $I_B$, $I_{B1}$ and $I_{B2}$ designate current sources, respectively.

The OTA Of FIG. 3A simply uses a differential pair. Here, the OTA has an input/output transfer function as follows:

$$I_0 = I_1 - I_2$$
$$= (V_1 - V_2) \cdot \sqrt{2I_B \beta} \cdot \sqrt{1 - \frac{2\beta}{I_B} \cdot (V_1 - V_2)^2}$$

where, $\beta$ is an input/output transconductance of the MOS transistor.

As seen from the above description, the output current is expressed by the input voltage and conductance. The output signal is reduced in linearity as the input signal becomes higher.

The OTA of FIG. 3B uses a quadratic function characteristic of the MOS transistor. As shown in FIG. 3B, the OTA comprises two MOS transistors and two voltage sources. An input circuit in the AB class is a representative of such a construction. Here, the OTA has an input/output transfer function as follows:

$$I_0 = I_1 - I_2 = 4\beta(V_1 - V_2) \cdot V_k$$

where, $$V_k = V_{cf} - V_f$$

In FIG. 3C, two differential pairs are used to embody the OTA. This construction is provided to remove a non-linearity with a single differential pair to increase the linearity. In order to remove the non-linearity, the sizes and currents of the differential pairs must satisfy the following relational expression:

$$\left[\frac{(W/L)_1}{(W/L)_2}\right]^{3/2} = \left[\frac{I_{B1}}{I_{B2}}\right]^{1/2}$$

Figure 4A:
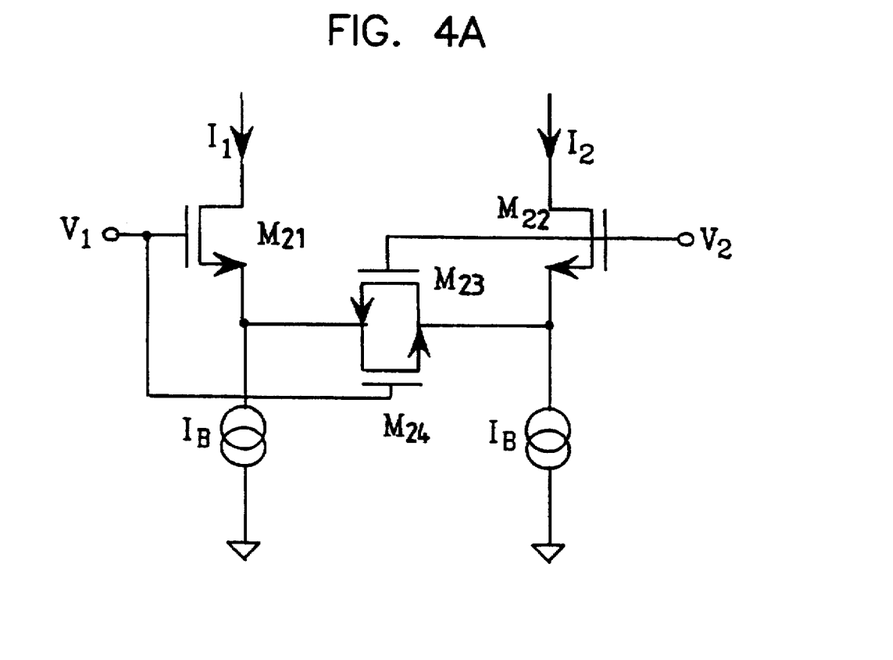
FIGS. 4A and 4B are circuit diagrams of conventional OTAs using linear regions of MOS transistors.
Figure 4B:
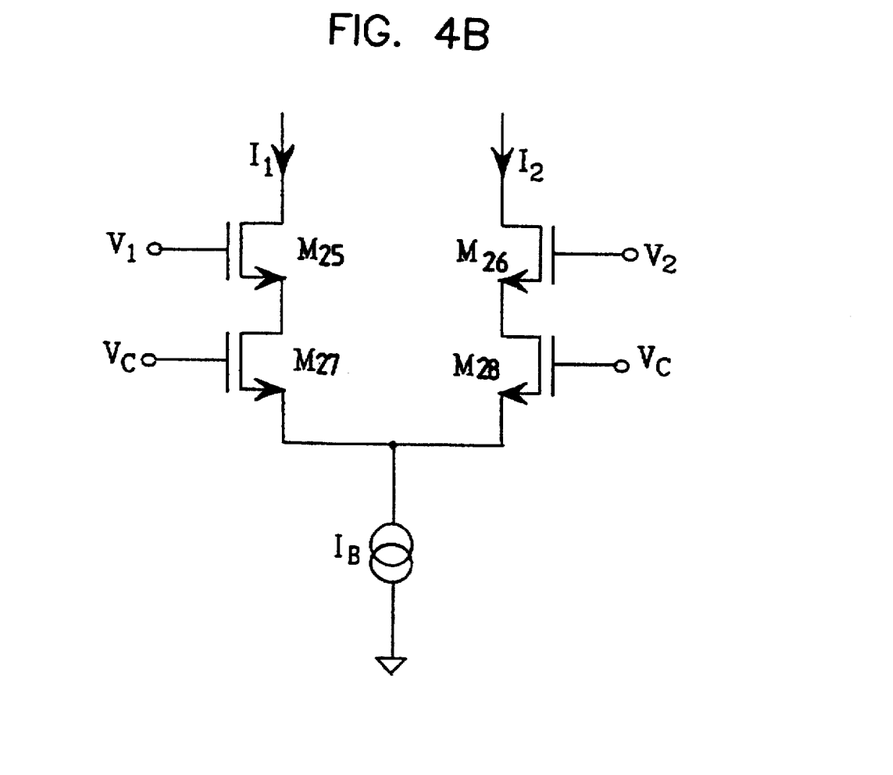

FIGS. 4A and 4B are circuit diagrams of conventional OTAs using linear regions of MOS transistors. In these drawings, the reference numerals $M_{21}$ to $M_{28}$ designate MOS transistors, respectively, and the reference numeral $I_B$ designates current sources.

In FIG. 4A, the MOS transistors $M_{21}$ and $M_{22}$ have their sources connected to the current sources $I_B$. The MOS transistors $M_{21}$ and $M_{22}$ operate in their saturation regions to buffer an input signal, and transfer the buffered signal to their sources.

The MOS transistors $M_{23}$ and $M_{24}$ operate in their linear regions to act as resistors. The MOS transistors $M_{23}$ and $M_{24}$ are complementary to each other to increase the linearity.

In FIG. 4B, the MOS transistors $M_{25}$ to $M_{28}$ are connected to the current source $I_B$. The OTA of FIG. 4B operates in a similar manner to that of FIG. 4A to have the linear input/output transfer function.

However, the above-mentioned conventional OTAs have a disadvantage in that the input signal is limited in range, thereby reducing a signal magnitude of the entire circuit. Such a reduction in signal magnitude results in a reduction in signal input/output range and a degradation in signal to noise (S/N) ratio.

SUMMARY OF THE INVENTION

Therefore, the present invention has been made in view of the above problems, and it is an object of the present invention to provide an OTA with a good linearity which is embodied using operational amplifiers and MOS transistors to have a linear input/output voltage-current relation and a wide input voltage range.

In accordance with an aspect of the present invention, there is provided an operational transconductance amplifier with a good linearity, comprising a first MOS transistor having its one terminal connected to a ground voltage source and its gate terminal for receiving a circuit input voltage, the first MOS transistor converting the input voltage into an output current; a second MOS transistor having its one terminal connected to the other terminal of the first MOS transistor and its other terminal connected to a supply voltage source, the second MOS transistor transferring current flowing through the first MOS transistor to its output terminal; reference voltage generation means for generating a reference voltage; and an operational amplifier having its negative input terminal connected to a junction between the first and second MOS transistors, its positive input terminal connected to an output terminal of the reference voltage generation means and its output terminal connected to a gate terminal of the second MOS transistor.

In accordance with another aspect of the present invention, there is provided an operational transconductance amplifier with a good linearity, comprising current pass means for passing current to a ground voltage source; a first transistor having its one terminal connected to the current pass means and its gate terminal for receiving a first input voltage; a second transistor having its one terminal connected to the other terminal of the first transistor and its other terminal connected to a supply voltage source; reference voltage generation means for generating a reference voltage; a first operational amplifier having its negative input terminal connected to a junction between the first and second transistors, its positive input terminal connected to an output terminal of the reference voltage generation means and its output terminal connected to a gate terminal of the second transistor; a third transistor having its one terminal connected to the current pass means and its gate terminal for receiving a second input voltage; a fourth transistor having its one terminal connected to the other terminal of the third transistor and its other terminal connected to the supply voltage source; and a second operational amplifier having its negative input terminal connected to a junction between the third and fourth transistors, its positive input terminal connected to the output terminal of the reference voltage generation means and its output terminal connected to a gate terminal of the fourth transistor.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

First, the fundamental principle of the present invention will hereinafter be described with reference to FIG. 5.

Figure 5:
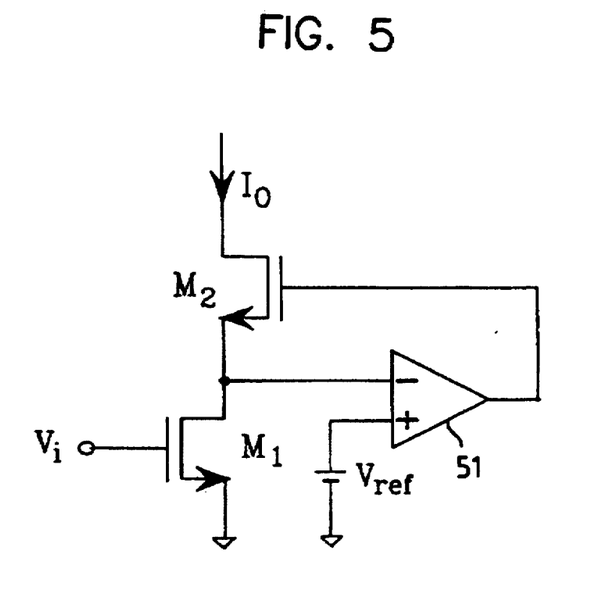
FIG. 5 is a circuit diagram of an OTA in accordance with an embodiment of the present invention.

Referring to FIG. 5, there is shown a circuit diagram of an OTA in accordance with an embodiment of the present invention. As shown in this drawing, the OTA comprises first and second MOS transistors $M_1$ and $M_2$ and an operational amplifier 51. The first MOS transistor $M_1$ has its one terminal connected to a ground voltage source and its gate terminal for receiving a circuit input voltage. The second MOS transistor $M_2$ has its one terminal connected to the other terminal of the first MOS transistor $M_1$ and its other terminal connected to a supply voltage source. The operational amplifier 51 has its negative input terminal connected to a junction between the first and second MOS transistors $M_1$ and $M_2$, its positive input terminal connected to an output terminal of a reference voltage generator and its output terminal connected to a gate terminal of the second MOS transistor $M_2$.

The operation of the OTA with the above-mentioned construction in accordance with the embodiment of the present invention will hereinafter be described in detail.

The first MOS transistor $M_1$ operates in its linear region in which the relation between input voltage and output current is linear. The first MOS transistor $M_1$ acts as a transconductor for converting the input signal into the output current. The second MOS transistor $M_2$ operates in its saturation region. The second MOS transistor $M_2$ cooperates with the operational amplifier 51 to form a negative feedback loop. This negative feedback loop allows the second MOS transistor $M_2$ to transfer current flowing through the first MOS transistor $M_1$ to its output terminal. Here, the input MOS transistor $M_1$ has the same drain voltage as a reference voltage $V_{ref}$ at the positive input terminal (+) of the operational amplifier 51.

The OTA has an input/output voltage-current characteristic as follows:

$$I_0 = \beta_1 \left[ (V_i - V_T) \cdot V_{DS} - \frac{1}{2} V_{DS}^2 \right]$$

$$= \beta_1 \left[ (V_i - V_T) \cdot V_{ref} - \frac{1}{2} V_{ref}^2 \right]$$

If the reference voltage $V_{ref}$ from the reference voltage generator is always constant regardless of the input voltage in the above relational expression, the output current will have a first-degree expression with respect to the input voltage. As a result, the input/output relational expression will have a linearity.

Figure 6:
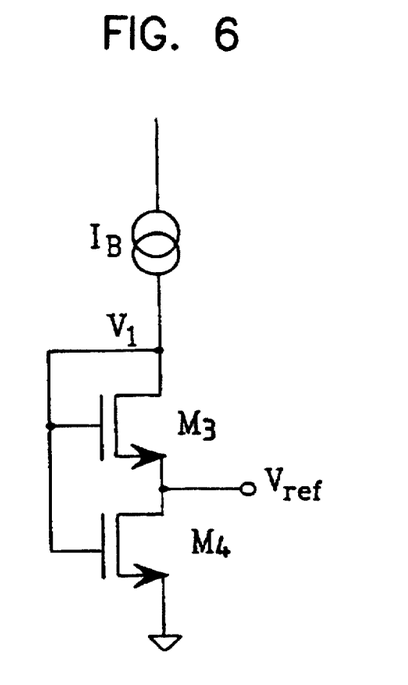
FIG. 6 is a circuit diagram of a reference voltage generator in FIG. 5.

Referring to FIG. 6, there is shown a circuit diagram of the reference voltage generator in FIG. 5. As shown in this drawing, the reference voltage generator includes third and fourth MOS transistors $M_3$ and $M_4$. The third MOS transistor $M_3$ has its one terminal and its gate terminal connected in common to a current source $I_B$. The fourth MOS transistor $M_4$ has its one terminal connected to the other terminal of the third MOS transistor $M_3$, its gate terminal connected to the current source $I_B$ and its other terminal connected to the ground voltage source. The reference voltage $V_{ref}$ is outputted at a junction between the third and fourth MOS transistors $M_3$ and $M_4$.

The third MOS transistor $M_3$ operates in its saturation region and the fourth MOS transistor $M_4$ operates in its linear region. As a result, the relational expression can be given as follows:

$$V_1 - V_T = \sqrt{\frac{2I_B(W_1+W_2)L}{K_P W_1 W_2}}$$

Here, $W_1$ and $W_2$ are channel widths of the third and fourth MOS transistors $M_3$ and $M_4$, respectively, L is a channel length of the third and fourth MOS transistors $M_3$ and $M_4$ on the assumption that the third and fourth MOS transistors $M_3$ and $M_4$ have the same channel length, and $K_P$ is a transconductance parameter of the third and fourth MOS transistors $M_3$ and $M_4$.

The third MOS transistor $M_3$ has a gate-source voltage which can be expressed as follows:

$$V_1 - V_{ref} - V_T = \sqrt{\frac{2I_B L}{K_P W_1}}$$

Hence, the reference voltage $V_{ref}$ can be expressed as follows:

$$V_{ref} = \sqrt{\frac{2I_B L}{K_P}} \left\{ \sqrt{\frac{W_1+W_2}{W_1 W_2}} - \sqrt{\frac{1}{W_1}} \right\}$$

Figure 7:
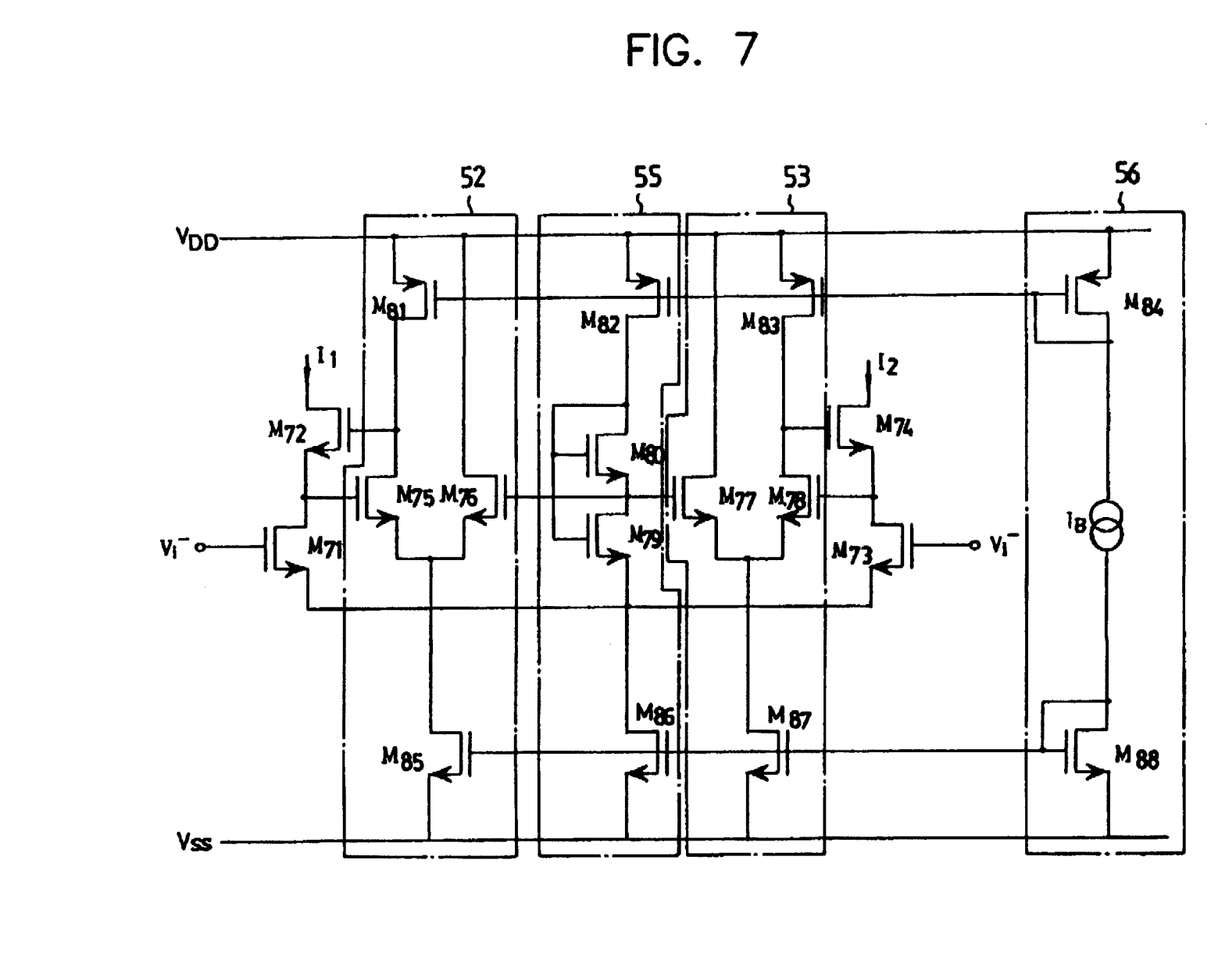
FIG. 7 is a circuit diagram of an OTA in accordance with an alternative embodiment of the present invention.

Referring to FIG. 7, there is shown a circuit diagram of an OTA in accordance with an alternative embodiment of the present invention. In this drawing, the reference numerals $M_{71}$ to $M_{88}$ designate MOS transistors, respectively, the reference numeral 55 designates a reference voltage generator 55, the reference numerals 52 and 53 designate operational amplifiers, respectively, and the reference numeral 56 designates a current mirror.

As shown in FIG. 7, the OTA comprises two operational amplifiers 52 and 53 and one reference voltage generator 55.

In more detail, input MOS transistors $M_{71}$ and $M_{73}$ are provided to convert input voltages into currents. The MOS transistors $M_{71}$ and $M_{73}$ operate in their linear regions. MOS transistors $M_{72}$ and $M_{74}$ are cascaded to the input MOS transistors $M_{71}$ and $M_{73}$, respectively, to transfer current signals from the input MOS transistors $M_{71}$ and $M_{73}$ to their output terminals.

The operational amplifier 52 includes MOS transistors $M_{75}$ and $M_{76}$ which form a differential pair for operating on a first input signal. The operational amplifier 53 includes MOS transistors $M_{77}$ and $M_{78}$ which form a differential pair for operating on a second input signal. The reference voltage generator 55 includes MOS transistors $M_{79}$ and $M_{88}$ for supplying a reference voltage to the operational amplifiers 52 and 53. The reference voltage is determined according to currents and sizes of the MOS transistors $M_{79}$ and $M_{80}$. Drain-source voltages of the input MOS transistors $M_{71}$ and $M_{73}$ are determined according to the reference voltage from the reference voltage generator 55.

The transconductance is determined according to the sizes and drain-source voltages of the input MOS transistors $M_{71}$ and $M_{73}$. The drain-source voltages of the input MOS transistors $M_{71}$ and $M_{73}$ can be given as follows:

$$V_{DS71} = V_{DS72} = V_{DS}$$

$$= \sqrt{\frac{2I_{DS0}L}{K_p}} \left\{ \sqrt{\frac{W_{79}+W_{80}}{W_{79}W_{80}}} - \sqrt{\frac{1}{W_{80}}} \right\}$$

Hence, the following currents flow through the input MOS transistors $M_{71}$ and $M_{73}$, respectively:

$$I_{DS71} = K_p \frac{W_{71}}{L} \left[ (V_i^+ - V_{71} - V_1) \cdot V_{DS71} + \frac{1}{2} V_{DS71}^2 \right]$$

$$I_{DS72} = K_p \frac{W_{72}}{L} \left[ (V_i^- - V_{71} - V_1) \cdot V_{DS72} + \frac{1}{2} V_{DS72}^2 \right]$$

On the assumption that the two input MOS transistors $M_{71}$ and $M_{73}$ have the same size and the same drain-source voltage, the circuit output current can be expressed as follows:

$$I_{OUT} = I_{DS71} - I_{DS72} = K_p \frac{W_{71}}{L} V_{DS71}(V_i^+ - V_i^-) = g_m \cdot V_{in}$$

As seen from the above result, the input/output transconductance has a very linear current relational expression. Here, the conductance is adjustable according to $V_{DS71}$.

The input voltage range of the present circuit is defined by the operating range of the input MOS transistors $M_{71}$ and $M_{73}$ in their linear regions. As a result, the input voltage range is determined according to gate-source voltages of the input MOS transistors $M_{71}$ and $M_{73}$. The input voltage can have a peak-to-peak range as follows:

$$V_{in(p-p)} = 4 \cdot (V_{GD1} - V_{Tn})$$

Generally, an OTA employing a saturation region of MOS transistor has an input signal range which is narrower by about $$1/\sqrt{2}$$

than that in the present circuit.

As apparent from the above description, according to the present invention, the OTA can have a linear input/output voltage-current relation and a wide input voltage range. Therefore, the present invention has the effect of providing the OTA with good linearity.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An operational transconductance amplifier with a good linearity, comprising a first transistor coupled to a negative supply voltage input signal for receiving the negative voltage input signal and converting said negative voltage input signal to a first current signal;

a second transistor coupled to a drain of said first transistor for maintaining drain voltage of said first transistor and transferring the first current signal from said first transistor to an output terminal;

a third transistor coupled to a positive supply voltage input signal for receiving the positive voltage input signal and converting said positive voltage input signal to a second current signal;

a fourth transistor coupled to a drain of said third transistor for maintaining constant drain voltage of said third transistor and transferring the second current signal passing through said third transistor to an output terminal;

a reference voltage generation means for generating a reference voltage;

a first operational amplifier having its negative input terminal coupled to a junction between said first transistor and said third transistor, its positive input terminal coupled to an output terminal of said reference voltage generation means, and its output terminal coupled to a gate terminal of said second transistor;

a second operational amplifier having its negative input terminal coupled to a junction between said third transistor and said fourth transistor, its positive input terminal coupled to an output terminal of said reference voltage generation means, and its output terminal coupled to a gate terminal of said fourth transistor; and a current mirror for connecting said first and second operational amplifiers and said reference voltage generation means to said supply voltage source and a ground voltage source, said current mirror for obtaining total current.

* * * * *